United States Patent

Bou-Ghazale et al.

[19]

[11] Patent Number: 5,844,921
[45] Date of Patent: Dec. 1, 1998

[54] METHOD AND APPARATUS FOR TESTING A HYBRID CIRCUIT HAVING MACRO AND NON-MACRO CIRCUITRY

[75] Inventors: Silvio Bou-Ghazale, Chandler, Ariz.; Stephen Douglas Weitzel, Round Rock, Tex.

[73] Assignee: International Business Machines Corporation, Armonk, N.Y.

[21] Appl. No.: 608,591

[22] Filed: Feb. 28, 1996

[51] Int. Cl.[6] .......................... G01R 31/28; G06F 11/22; G06F 11/28

[52] U.S. Cl. ................. 371/22.1; 371/22.3; 395/183.18; 395/183.06

[58] Field of Search .................................. 371/22.1, 22.2, 371/22.3, 22.4, 22.5, 22.6; 395/183.18, 183.06; 324/158 R

[56] References Cited

U.S. PATENT DOCUMENTS

| | | | |
|---|---|---|---|
| 3,961,254 | 6/1976 | Cavaliere et al. | 324/73 |
| 4,845,633 | 7/1989 | Furtek | 364/490 |
| 4,872,169 | 10/1989 | Whesel, Jr. | 371/22.3 |
| 4,931,722 | 6/1990 | Stoica | 371/22.5 |
| 5,150,044 | 9/1992 | Hashizume et al. | 324/158 R |
| 5,168,499 | 12/1992 | Peterson et al. | 371/11.3 |
| 5,255,203 | 10/1993 | Agrawal et al. | 364/489 |
| 5,260,881 | 11/1993 | Agrawal et al. | 364/489 |
| 5,450,021 | 9/1995 | Chiang | 326/39 |
| 5,581,698 | 12/1996 | Miwa et al. | 395/183.18 |

*Primary Examiner*—Hoa T. Nguyen

[57] ABSTRACT

A hybrid circuit board capable of operating in a functional mode and a test mode includes macro block circuitry and non-macro block circuitry surrounding the macro block circuitry. The circuit board includes a test bridge circuit coupling the macro block circuitry to the surrounding non-macro block circuitry during the functional mode and for bypassing the macro block circuitry during the test mode. The test bridge circuit is responsive to a mode signal for isolating outputs of the macro block and for coupling the inputs of the macro block to isolated outputs of the macro block during the test mode. A mapping circuit maps the inputs of the macro block to the inputs of the non-macro circuit.

10 Claims, 8 Drawing Sheets

METHOD AND APPARATUS FOR TESTING A HYBRID CIRCUIT HAVING MACRO AND NON-MACRO CIRCUITRY

TECHNICAL FIELD

This invention generally relates to the field of in-circuit testing and more particularly to testing hybrid circuitry containing both macro blocks as well as combinational/sequential non-macro circuits.

BACKGROUND OF THE INVENTION

One factor contributing to reduction in size of computer devices and increased packaging densities of computer chips is the inclusion of embedded functional blocks otherwise known as macro blocks in computer system design circuitry. Generally, macro blocks comprise logical circuitry which perform a specified function, such as timers, direct memory access (DMA) function, etc.

As circuit density is increased, a need arises for in-circuit testing of all circuit components in order to insure system reliability. Macro components are usually tested by manufacturers before being incorporated into an electronic circuit, such as an integrated circuit chip or a circuit board. Non-macro circuit components are utilizing well known in circuit test schemes during the manufacturing process. For example J-Tag technique performs in circuit testing by serially inputting and shifting a predetermined logical sequences into one or more in-circuit latch elements and testing for deterministic and measurable output sequences. The process of serially shifting test data into latch elements is known as scanning in test data and the process of serially shifting test data out of such latch elements is known as scanning out test data.

Referring to FIG. 1, diagram of a non-macro circuit 100 which uses a conventional test technique is shown. The circuit 100 consists of a combinational logical circuitry 101 having Input and Output Signals and Latches 102 consisting of one or more latch elements 109 comprising well known latch circuits for storing test data. During functional mode, Latches 102 stores signals from the non-macro circuit 101 and returns the stored data as input signals to the non-macro circuit 101. However, during test mode, the latch elements 109 form a shift register, where a test sequence is scanned in via Test Data In terminal and a deterministic output sequence is scanned out and measured at Test Data Out terminal. The shift register configuration of Latches 102 during test mode allows test data to be serially scanned into the latch elements 109, thereby allowing for storage of a specific test patterns where deterministic output sequence can be stored and measured. The ability to apply test patterns utilizing the Latches 102 in both functional and test modes enables high coverage testing of circuitry contained within the non-macro circuit 101.

However, when Macro and non-macro components are combined to form a hybrid circuit, conventional in circuit testing, such as the one described above, is no longer effective for testing such hybrid circuit. This is because application of a predetermined test sequence through a macro block results in unknown or easily determinable output. Thus, a conventional test scheme which relies on predefined inputs resulting in predetermined outputs can not be utilized for testing a hybrid circuit which contains both macro and non-macro components.

Conventional techniques for testing such hybrid circuit include isolating the macro by actual breakage of the circuit paths to the macro. One such hybrid circuit which uses conventional test techniques is shown in FIG. 2. FIG. 2 illustrates a hybrid circuit 200 consisting of a both a non-macro circuit portion 201 and a macro block 203. As shown, The macro block 203 receives M input signals outputted from the non-macro circuit portion 201 and generates N output signals which are inputted back into the non-macro circuit portion. Depending on the functionality provided by the macro block 203, the non-macro outputs connected to the inputs of the macro block 203 can not be deterministically measured and relied upon for test purposes. Thus, conventionally hybrid circuits are tested by surrounding the macro block 203 with additional Latches 205 and Latches 207 which are serially coupled to each other and Latches 211. Under this arrangement, during functional mode, functional signals pass unimpeded from the non-macro circuit portion 201 to the macro block 203 through the Latches 205 and 207. However, during test mode, the latching elements of Latches 205, 207 and 211 form a shift register when test data is scanned into the Test Data In terminal of Latches 205(i.e., the first latch element of Latches 205) through Latches 207 and is scanned out at Test Data Out terminal of Latches 211 (i.e., the last latch element of Latches 211).

However, introduction of Latches 205 and Latches 207 to test the hybrid circuit 200 in addition to requiring the expense of adding significant latch circuits into the hybrid circuit also degrades its performance by adding propagation delays into and out of the macro block 203.

Therefore there exists a need for testing a hybrid circuit without adding significant test circuitry and degrading circuit performance.

SUMMARY OF THE INVENTION

According to the present invention, a hybrid circuit capable of functioning in a test mode and a functional mode in response to a test mode control signal comprises a macro block and a non-macro circuit portion. The hybrid circuit includes an isolation circuit responsive to the test mode control signal for isolating the macro block outputs from the non-macro circuit during the test mode. A bypass path circuit responsive to the test mode control signal bypasses the macro block by coupling the non-macro outputs to the macro block to non-macro inputs from the macro block during test mode.

DETAILED DESCRIPTION OF THE PREFERRED EMBODIMENT

Figure 3:
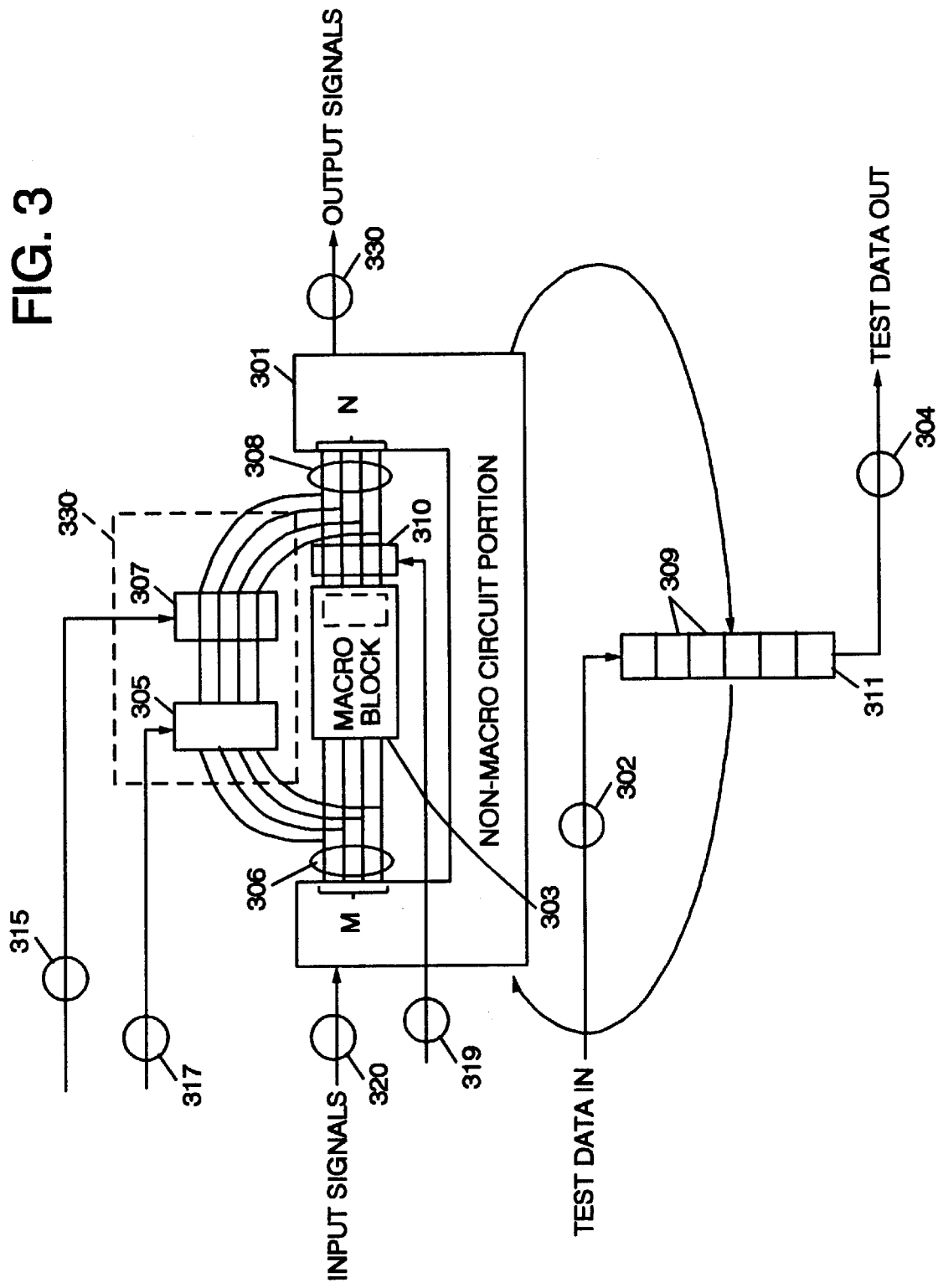
FIG. 3 is a circuit diagram of a hybrid circuit with test capability according to the present invention.

Referring to FIG. 3 a hybrid electronic circuit 300 comprising a non-macro circuit portion 301 and a macro block 303 is shown. The hybrid circuit 300 may comprise a wide variety of electronic system circuits having logical elements disposed on a suitable substrate, such as an Integrated Circuit (IC) chip substrate or a circuit board substrate. The macro block 303 comprises a logical circuit, consisting of combinational and/or sequential circuits having a predefined, self-contained function, such as a timer function or a direct memory access (DMA) function. As is well known, a macro block, such as the macro block 303, has an optimized circuit design electronically implemented using few logical circuits. The macro block can be incorporated within an electronic circuit system design to perform the predefined function in combination with non-macro circuitry. The macro block 303 has its own test circuitry including test input and output signals which are not shown in FIG. 3 and utilizes manufacturer specific test methodology to test the logical and analog circuits contained within the macro block 303. The non-macro circuit 301 comprises logical circuitry containing combinational logic (AND, OR, NAND, etc.) and/or sequential circuits (e.g. flip flops, registers, etc.) which are intended to work with the macro block 303 to implement a circuit design, such as a central electronic complex of an information handling system.

As shown, the non-macro circuit 301 has a number of inputs 320 and a number of outputs which interface the hybrid circuit 300 with surrounding circuitry (not shown). The inputs and outputs of the non-macro circuit 301 are connected to Latches 311 comprising well known circuitry utilized in the industry for performing scan test on electronic circuitry. Latches 311 include one or more latch elements 309 where the number of latch elements is equal to the number of input signals to 311 and where each latch element 309 receives one output from the non-macro circuit 301 and provides one output to the input of the macro block 303 in a well known manner. During functional mode, Latches 311 stores signals from the non-macro circuit 301 and returns the stored data as input signals to the non-macro circuit 301. Also as shown, the macro block 303 receives M macro inputs 306 from the non-macro circuit 301 at one circuit stage and provides N macro outputs macro outputs 308 to the non-macro circuit 301 at another circuit stage. According to the present invention, in response to a test mode control signal 319, the hybrid circuit 300 is capable of functioning in a test mode or a functional mode. The hybrid circuit 300 includes a macro isolation circuit 310 for isolating the macro block 303 from the non-macro circuit 301 and a bypass path circuit 330 comprising a test bridge circuit 307 for bypassing the macro block 303 during the test mode. The macro isolation circuit 310, which comprises well known isolation elements such as switches or multiplexers, is responsive to the test mode control signal 309 for disabling or otherwise isolating the outputs of the macro block 303. The test bridge 307 circuit comprises well known bypassing elements, such as switches, coupling one or more macro inputs 306 from the non-macro circuit 301 to one or more macro outputs to the non-macro circuit 301 during the test mode. If the number of macro inputs 306 from the non-macro circuit 303 is unequal to the number of macro outputs 308 to the non-macro circuit 301, the bypass path circuit 330 also includes a mapping circuit 305 for mapping macro inputs 306 to the macro outputs 308, in order to bypass the macro block 303 through the bypass path circuit 330. Accordingly, the present invention contemplates a method of testing the hybrid circuit 300 by mapping the macro inputs 306 to the macro outputs 308 if the number of such inputs and outputs are unequal, and by isolating the the macro block 303 from the non-macro circuit and coupling the mapped macro inputs 306 from the non-macro circuit 301 to the macro output 308 to to the non-macro circuit 301, thus bypassing the macro block 303. By bypassing the macro block 303, the present invention contemplates testing the non-macro circuit portion 301 of the hybrid circuit 300 using conventional test scan methods.

As shown in FIG. 3, the hybrid circuit 300 includes a bypass path circuit comprising a M×N Mapping circuit 305 and a N×N Test Bridge 307. The inputs of the M×N Mapping circuit 305 are connected to the M macro inputs 306 from the non-macro circuit 301 and the outputs the M×N Mapping circuit 305 are connected to the inputs of the N×N Test Bridge 307. The outputs of the N×N Test Bridge 307 are connected to the N the macro outputs 308 to the non-macro circuit 301. The mapping circuit 305 is responsive to a Map Control signal 317 which maps the M macro inputs 306 to for connection to the N macro outputs of the mapping circuit 305. The test bridge 307 is responsive to one state of a Bridge Control signal 315 for isolating the outputs of the N×N Test Bridge 307 from the non-macro circuit 301 during functional mode and is also responsive to another state of the bridge control signal 315 for coupling such outputs to the non-macro circuit during test mode. The outputs of the N×N Test Bridge 307 are isolated from the non-macro circuit 301 by disconnecting from the macro outputs macro outputs 308 to the non-macro circuit 301 and they are coupled to the non-macro circuit 301 by connecting or otherwise coupling them to the macro outputs 308. In this embodiment, the macro isolation circuit 310 is responsive to a Test Control signal 319 which isolates the macro block 303 form the non-macro circuit 301 during test mode and couples the macro block 303 to the non-macro circuit 301 during functional mode. The macro block 303 is isolated from the non-macro circuit by disconnecting the outputs of the macro block 303 from the macro outputs 308 to the non-macro circuit 301 and it is coupled to the non-macro circuit 301 by connecting the outputs of the macro block 303 to the macro outputs 308 to the non-macro circuit 301. It may be appreciated that the macro block 303 may internally include its own output isolating circuitry, e.g. tri-statable outputs (shown by the dotted block) which are responsive to the Test Control signal 319 for internally isolating the outputs of the macro block 303. Thus, the internal isolation circuit may be substituted for the macro isolation circuit 310 shown externally.

As described in more detail below, the M×N Mapping circuit 305 comprises circuitry for mapping a first number of input signals, i.e. M, to a second number of output signals, i.e. N, so as to allow for bypassing of the macro block 303 during the test mode. In order to achieve such mapping, the present invention contemplates three situations where a) M is greater than N, b) where N is greater than M, and c) where N is equal to M.

Figure 4:
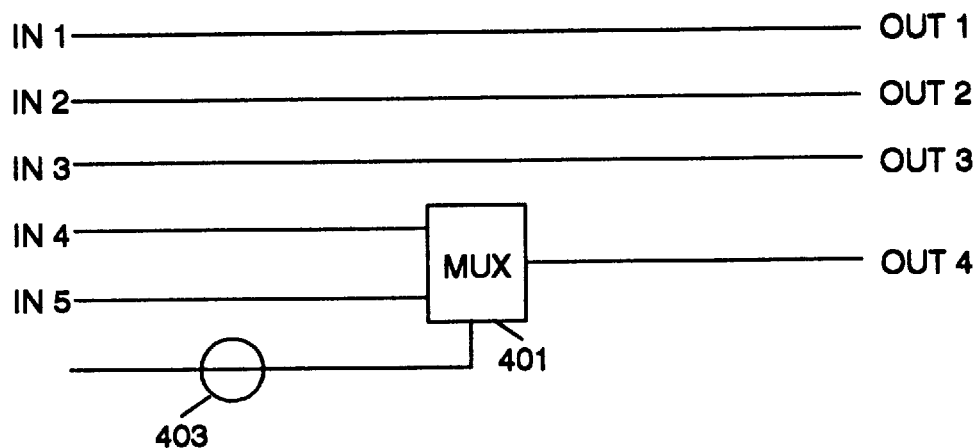
FIG. 4 is an exemplary circuit diagram of a Mapping circuit used in the hybrid circuit of FIG. 3.

Referring to FIG. 4, a diagram of an M×N Mapping circuit 400 is shown for mapping M inputs to N outputs where M is greater than N. The mapping circuit 400 maps a set of M inputs comprising IN1, IN2, IN3, IN4 and IN5 to a set of N outputs comprising OUT1, OUT2, OUT3 and OUT4 respectively. The circuit 400 includes a multiplexer circuit 401 which is responsive to a Multiplexer Control signal 403, which corresponds to the Map Control signal 317 of FIG. 3, for selecting either IN4 or IN5 for connection to OUT4, so that the signal on the selected input (i.e., IN4 or IN5) propagates to OUT4. As such, the 5 input signals (IN1, IN2, IN3, IN4 and IN5) are mapped to 4 output signals ( OUT1, OUT2, OUT3 and OUT4). The Multiplexer Control signal 403 is activated to perform the mapping function during the test mode. Where M is greater than N, it may be appreciated that utilizing the above described arrangement any number of input signals may be mapped to any number of output signals.

Figure 5:
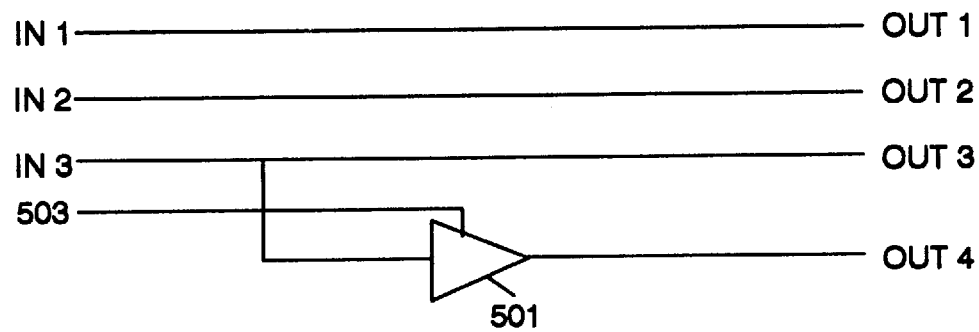
FIG. 5 is another exemplary circuit diagram of a Mapping circuit used in the hybrid circuit of FIG. 3.

Referring to FIG. 5, a diagram of an M×N Mapping circuit 500 is shown for mapping M inputs to N outputs where N is greater than M. IN1, IN2, and IN3 represent the M inputs to the M×N Map Circuit. Signals IN1, IN2, and IN3 are mapped directly to OUT1, OUT2, and OUT3 respectively. Since there is less input signals than output signals, the remaining output OUT4 is driven by another input signal using a buffer circuit 501 for coupling IN3 to OUT4. It may be appreciated that, if desired, the buffer circuit 501 may be controlled by a control signal 503 for coupling IN3 to OUT4.

As it may be appreciated, where the number of inputs M is equal to the number of outputs N, there is no need for mapping and the M×N Mapping circuit 305 may be replaced by the N×N Test Bridge 307.

Operationally, during functional mode, the macro isolation circuit 310 in response to the Test Control Signal 319 couples the outputs of the macro block 303 to the macro outputs 308 to the non-macro circuit 301, while the N×N Bridge Control 307 in response to the Bridge Control signal 315 disables its outputs so that no signals can propagate through the bypass path circuit 330. Thus, isolating the bypass path circuit 330 from the non-macro circuit 301. During functional mode, Test Control signal 319 is activated to couple the N outputs of macro block 303 to the macro outputs 308 to the non-macro circuit 301. As such functional signals are able to propagate from the non-macro circuit 301 through the macro block 303 to the macro outputs 308 to the non-macro circuit 301 causing the hybrid circuit 300 to function as intended. During the test mode, however, Test Control signal 319 is activated to isolate, via the macro isolation circuit 310, the outputs of the macro block 303 so that no signals can propagate from the M macro inputs 306 from the non-macro circuit 301 to the macro outputs 308 to the non-macro circuit 301. In this mode, the bypass path circuit 330 consisting of M×N Mapping circuit 305 and N×N Test Bridge 307 is activated by activation of the map control signal 317 and the bridge control signal 315 to map and couple the M macro inputs 306 from the non-macro circuit 301 to the N macro outputs 308 to the non-macro circuit 301. As such the bypass path circuit 330 creates a combinatorial circuit path across the macro block 303.

It may be appreciated that isolation and coupling of the macro block 303 and the bypass path circuit 330 is performed in a complementary fashion, i.e., when one is coupled the other is isolated and vice versa. As such, during the test mode, the map control signal 317 is activated as necessary to map the M macro inputs 306 from the non-macro circuit 301 to the N macro outputs 308 to the non-macro circuit 301, the bridge control signal 315 is activated to couple the outputs of the bridge circuit 307, and the test control signal 319 is activated to isolate or disable the outputs of the macro block 303 form the non-macro circuit 301. Thus, a single test mode control signal may be utilized to control Test Control signal 319 and the Bridge control signal 315. This would reduce the number of inputs to the electronic circuit shown in FIG. 3 and not change the operation of the circuits.

Figure 1:
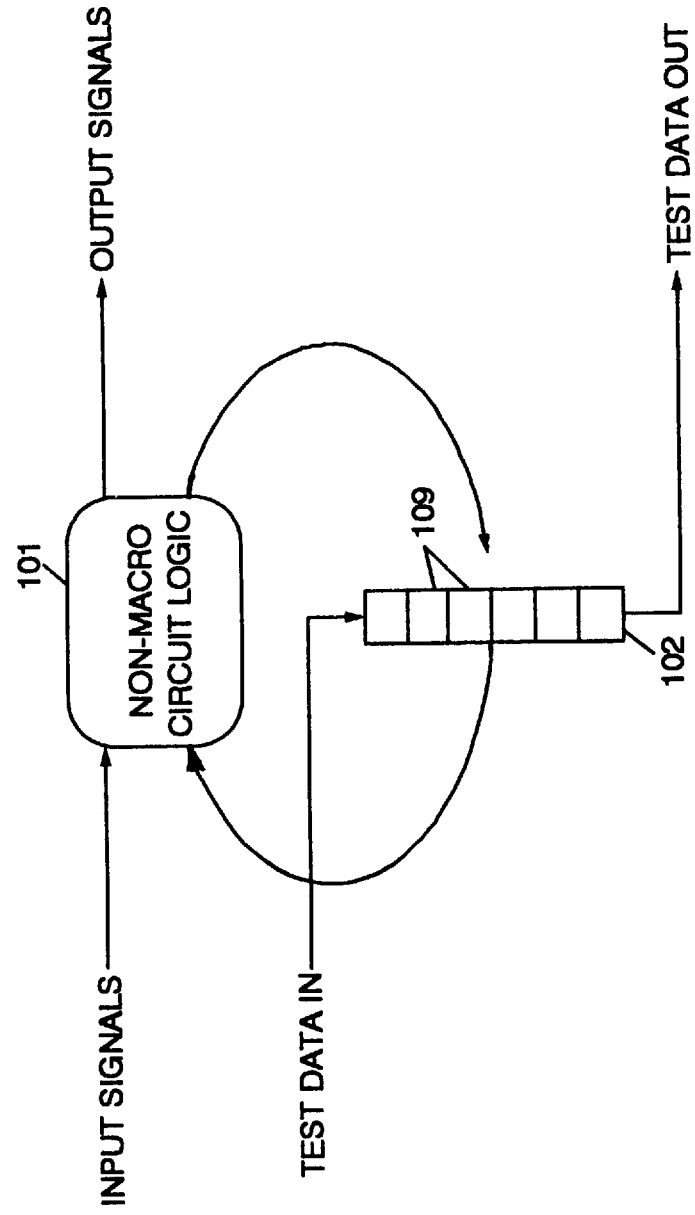
FIG. 1 is a prior art circuit diagram for testing non-macro circuits.
Figure 2:
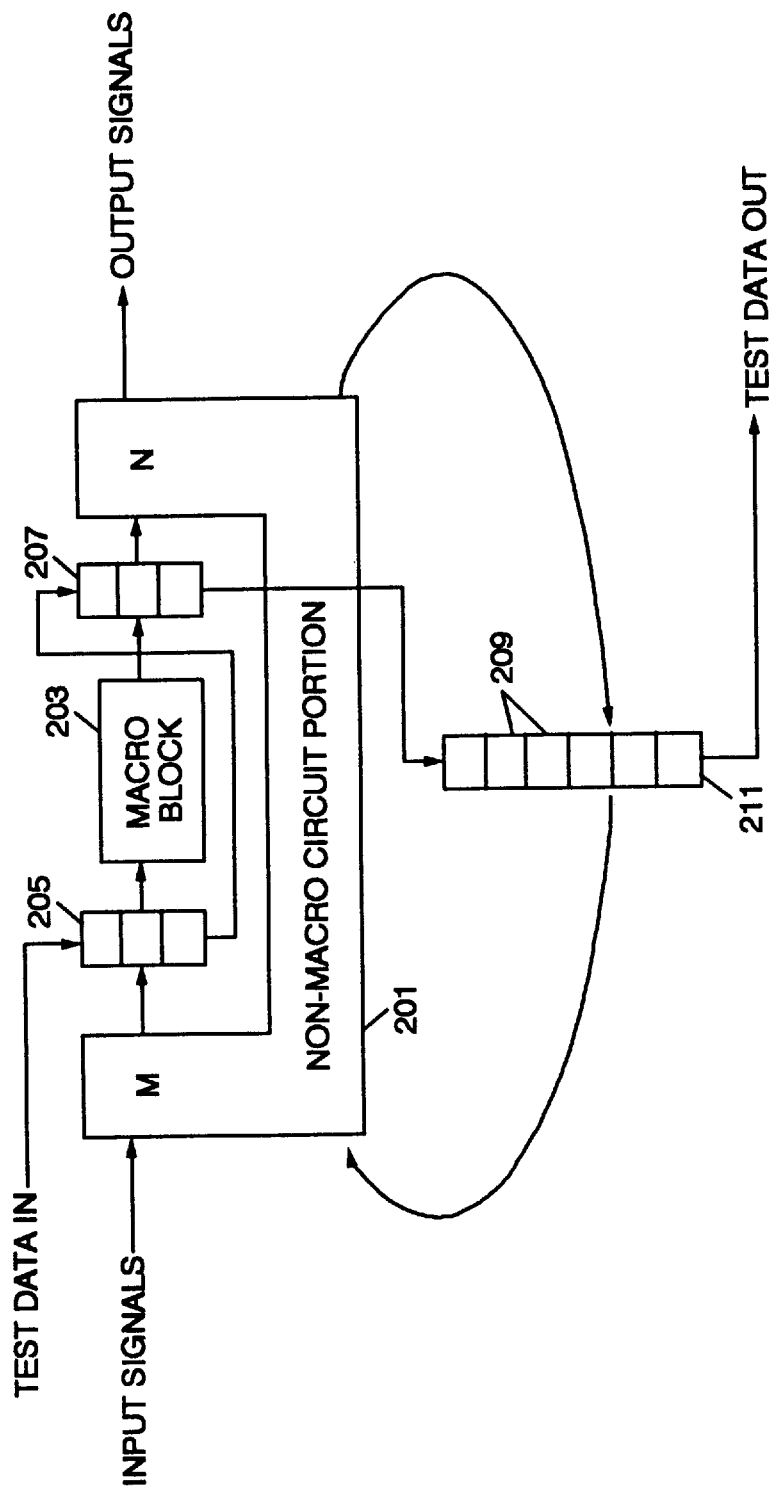
FIG. 2 is a prior art circuit diagram for testing a hybrid circuit containing both macro block and non-macro circuit.

As described above, by bypassing the macro block 303 and by creating a combinational logic path theracross, the hybrid circuit 300, for test purposes, effectively becomes the same circuit as the circuit 100 shown in FIG. 1. In this way, test patterns may be scanned into the Latches 311 via the Test Data In 302 and scanned out via the Test Data out 304. Thus, similar to the circuit 100 of FIG. 1, during test mode, the latch elements 309, contained within Latches 311, are connected in series to form a shift register. The input of the first latch element 309 in within the Latches 311 is connected to signal Test Data In 302, while the output of the last circuit 309 in the shift register within 311 is connected to signal Test Data Out 304. This serial connection of the memory elements 309 within Latches 311 allows test data to be serially shifted into the latch circuits 309 via the Test Data In 302, i.e. scanned in, thereby allowing for storage, within the Latches 311, of a specific input signal pattern to the non-macro circuit 301. Also, the shift register arrangement of the Latches 311 allows test data stored within the memory circuits 309 to be serially shifted out to Test Data Out 306, i.e. scanned out. Therefore, the M macro inputs 306 from the non-macro circuit 301 can now propagate through the bypass path circuit 330 and connect to the N macro outputs 308 to the non-macro circuit 301 and be measured using Latches 311.

Figure 6:
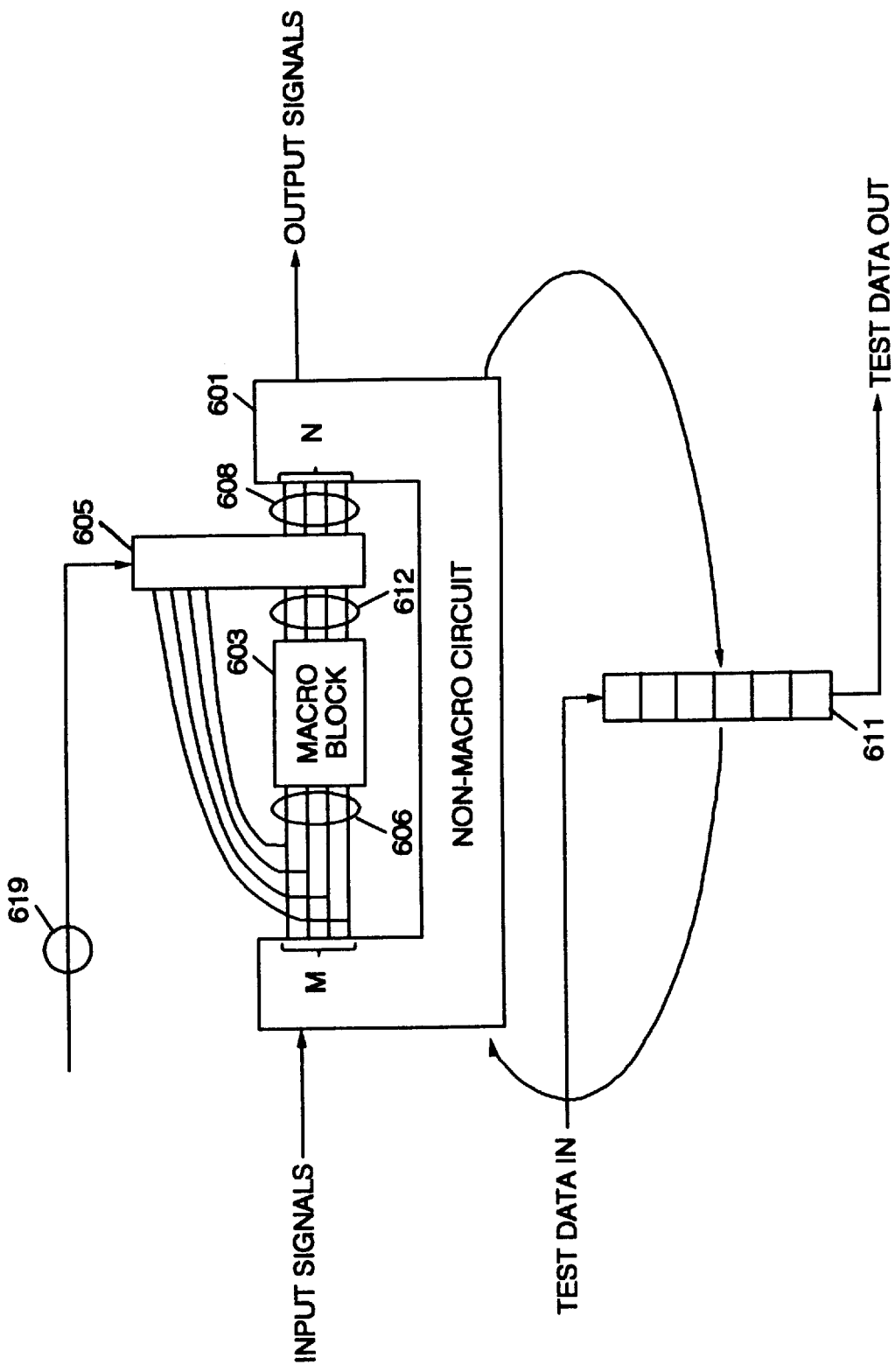
FIG. 6 is a circuit diagram of a hybrid circuit according to another embodiment of the present invention.

Referring to FIG. 6, another embodiment of the present invention is shown by the hybrid circuit 600 which similar to the hybrid circuit 300 includes a macro block 603 surrounded by a non-macro circuit 601. This embodiment integrates the mapping and isolation function necessary to perform the testing according to the present invention into a single block. Similar to the hybrid circuit 300, the non-macro circuit 601 has one or more inputs connected to Input Signals and one or more outputs connected to Output Signals. The non-macro circuit 601 has one or more inputs connected to the output of Latches 611 and one or more outputs connected to the input of Latches 611. The integrated mapping and isolation circuitry according to this embodiment of the present invention is contained in a bypass path circuit 605 which combines the mapping, bridging and isolation functions discussed in connection with the hybrid circuit 300 of FIG. 3.

The bypass path circuit 605 basically comprises a (M+N) ×N Map circuit, the inputs of which are connected to the M macro inputs 606 from the non-macro circuit 601 and to the N output 612 of the macro block 603. The N outputs of the bypass path circuit 605 are connected to the N macro inputs 608 to the non-macro circuit 601. Control Signal 619 selectively couples one or more (M+N) inputs to the bypass path circuit 605 to the N outputs of the bypass path circuit 605. According to this embodiment of the invention, the selective connection of the (M+N) inputs to N outputs in test mode is performed in such a manner that macro inputs 606 from the non-macro circuit 601 are mapped to the macro outputs 608 to the non-macro circuit 601 while isolating the outputs 612 of the macro block 603. In this way, the bypass path circuit 605 creates a combinational path across the macro block 603.

The specific implementations of the bypass path circuit 605 is described below with reference to FIGS. 7 and 8.

Figure 7:
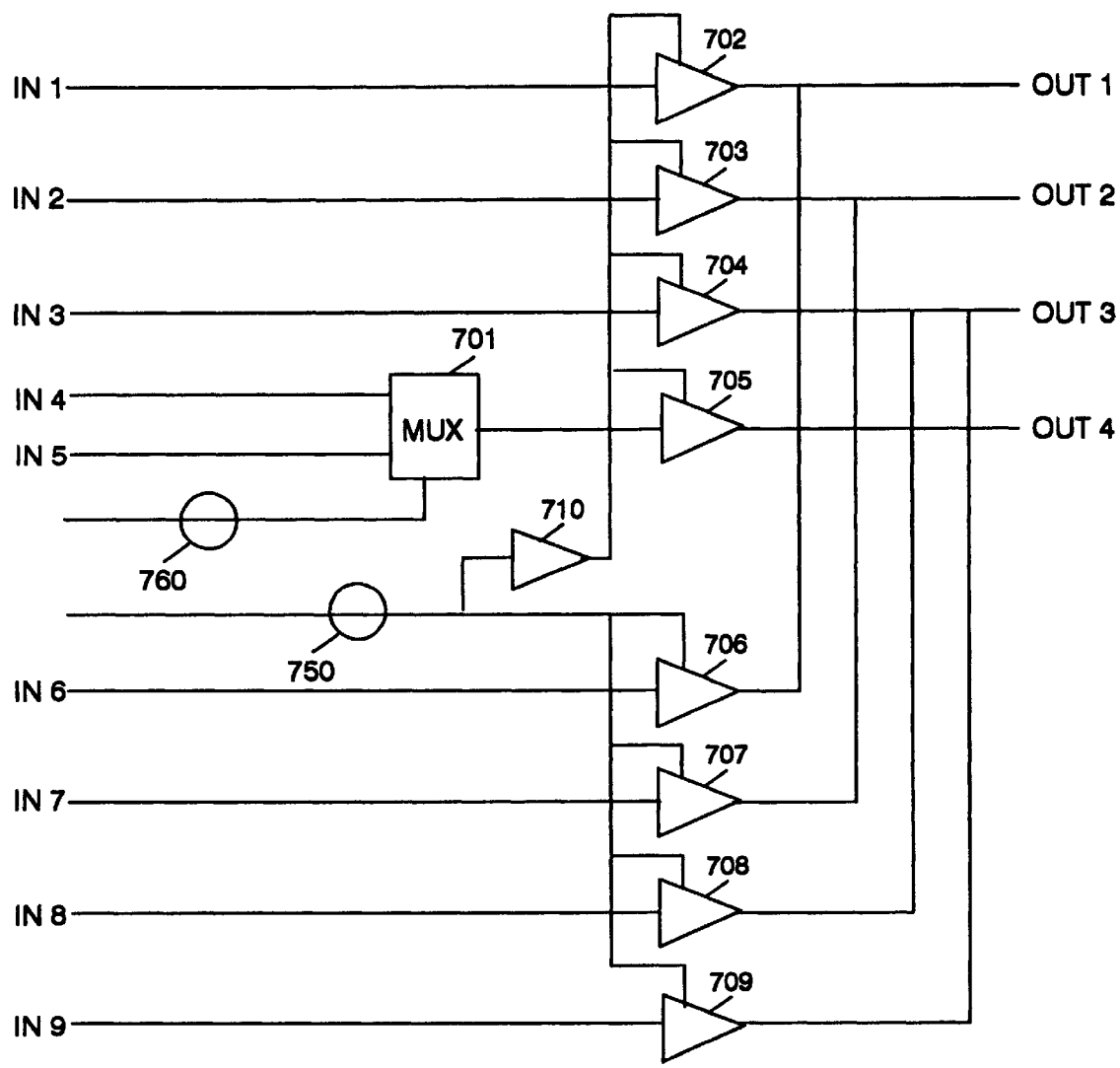
FIG. 7 is an exemplary circuit diagram of a Mapping and Isolation circuit used in the hybrid circuit of FIG. 6.

FIG. 7 shows an exemplary implementation of the bypass path circuit 605 using an (M+N)×N Map circuit 700 where M inputs is greater than the N outputs. The (M+N)×N Map circuit 700 connects a set of M inputs to N outputs based on a input control signal during test mode. During Test mode, the M inputs are connected to the N outputs. In this figure, IN1, IN2, IN3, IN4, and IN5 represent the M inputs while IN6, IN7, IN8, and IN9 represent the N inputs to the (M+N)×N Map circuit 700. Also shown in the figure are tri-state buffer blocks 702, 703, 704, 705, 706, 707, 708, and 709. The tri-state buffers 702–709 each have an input connected to input IN1–IN9 respectively, an output connected to outputs OUT1–OUT4, and a tri-state input coupled to a control signal 750. The control signal 750 couples to tri-state inputs of 702–705 through an inverter block 710, whereas it is directly connected to the tristate inputs of buffers 706–709. When the control signal 750 to the tri-state inputs of buffers 702–705 is at a logic high level, the signals at the inputs of buffers 702–705 are connected to the outputs of the tri-state buffers 702–705 so that the input signals can propagate freely to the outputs OUT1–OUT4 unimpeded. When the control signal 750 to the tri-state inputs of buffers 702–705 is at a logic low level, the signals at the inputs of the tri-state buffer 702–705 are isolated from its output and therefore the input signal can not propagate to the output. With the control signal 750 set to a logic low level, the tri-state buffers 702–705 can not drive the output to either a logic high or low level but provide a high output impedance to any signal connected to the output. Input signal Multiplexer Control signal 760 connected to multiplexer circuit 701 selects either IN4 or IN5 for connection to the input of tri-state buffer 705. Input Multiplexer Control 760 allows for selection of either IN4 or INS5 for connection to 705, so that the signal on the selected input propagates freely through 705 to OUT4. As such the control signal 750 and the Input Multiplexer control signal 760 collectively correspond to the Control Signal 619 of FIG. 6. It may be appreciated that if the number of inputs M is equal to the number of outputs N for an (M+N)×N Map circuit, then there is no need for multiplexer circuit 701. In this case, all M inputs can be directly connected to M unique corresponding tri-state buffers.

Tri-state buffers 706, 707, 708, and 709 are connected to inputs IN6, IN7, IN8, and IN9 and outputs OUT1, OUT2, OUT3, and OUT4 respectively. The control signal 750 controls the tristate buffers 706–709 in a complementary fashion to that of buffers 702–705. In that, when signal Test Control is a logic high level, inverter block 710 output is a logic low level. This logic low level causes the output of buffers 702–705 to be a high output impedance so that signals IN1, IN2, IN3, IN4 and IN5 are unable to propagate to outputs OUT1, OUT2, OUT3, and OUT4. However, the logic high level of signal Test Control signal 750 connected to tri-state inputs of buffers 706–709 permits input signals IN6, IN7, IN8, and IN9 to propagate freely through buffers 706–709 to outputs OUT1, OUT2, OUT3, and OUT4. When signal Test Control signal 750 is a logic low level, the outputs of tri-state buffers 706–709 are high impedance and input signals IN6, IN7, IN8, and IN9 are unable to propagate through 706–709 to outputs OUT1, OUT2, OUT3, and OUT4. As such, input signals IN6, IN7, IN8, and IN9 are isolated from outputs OUT1, OUT2, OUT3, and OUT4. At the same time, the logic low level on signal Test Control signal 750 causes inverter block 710 to generate a logic high level which when applied to tri-state inputs of buffers 702–704, permit signals IN1, IN2, and IN3 to propagate freely to outputs OUT1, OUT2, and OUT3. In this way, input signals IN1, IN2, and IN3 are mapped directly to OUT1, OUT2, and OUT3 respectively through buffers 702–704. Also, the logic high level at the tri-state input of buffer 705, permits the input signal of 705 to propagate freely to output OUT4 and depending on the state of Multiplexer control signal 760, to connect one of the IN4 or IN5 to OUT4.

Figure 8:
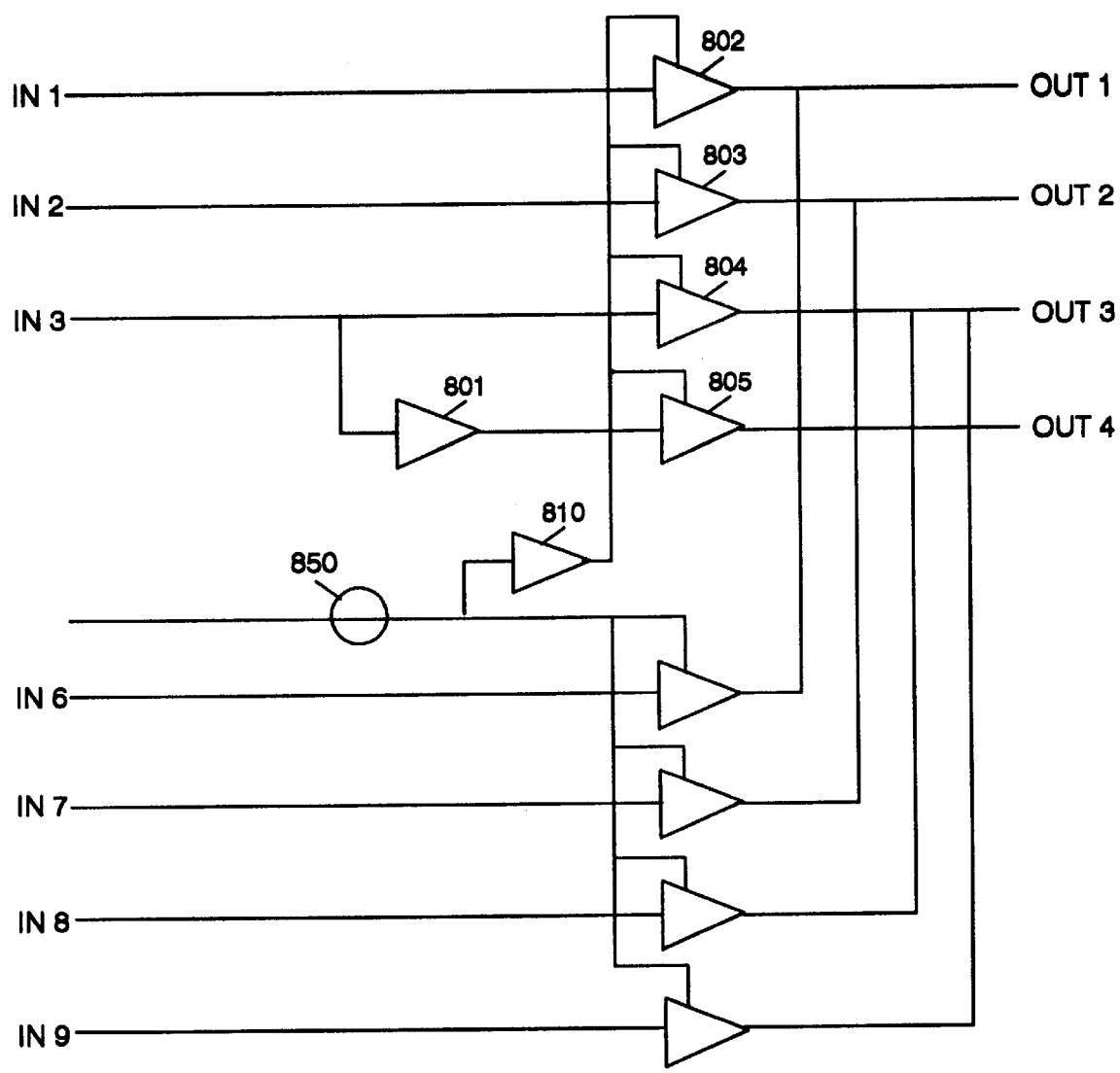
FIG. 8 is another exemplary circuit diagram of a Mapping and Isolation circuit used in the hybrid circuit of FIG. 6.

FIG. 8 shows implementation of the bypass path circuit 605 using an (M+N)×N Map circuit 800 where M inputs is less than the N outputs. Since there is an insufficient number of input signals M to be mapped to N outputs, the remaining outputs N–M must be driven by some another input signals. Shown in FIG. 8, IN3 is connected to buffer circuit 801. Buffer circuit 801 can be inverting or non-inverting and is connected to tri-state buffer 805. Responsive to control signal 850 which corresponds to the Control Signal 619 of FIG. 6, the logic state on the output of inverter block 810 connected to the cont of tri-state buffers 802–805 permits signals IN1, IN2, and IN3 to propagate freely through buffers 802–805 to outputs OUT1, OUT2, OUT3, and OUT4. As such, the input signals IN1, IN2, and IN3 are mapped to OUT1, OUT2, OUT3 and OUT4 respectively through 802–805.

Referring back to FIG. 6, operationally, during functional mode, the 605 in response to a first predefined state of the test mode Control Signal 619 will connect the N outputs 612 of the macro block 603 to the N macro outputs 608 to the non-macro circuit 601. Thus, functional signals are able to propagate from the M macro inputs 606 from the non-macro circuit 601 through the macro block 603 to the N macro outputs 608 to the non-macro circuit 601. The Control Signal 619 configures the logic paths within the bypass path circuit 605 to enable the N output signals 612 of the macro block 603 to propagate undisturbed through the bypass path circuit 605 to the N macro outputs 608 to the non-macro circuit 601. Thus, the hybrid circuit 600 operates as designed.

During test mode, however, the bypass path circuit 605 in response to a second predefined state of the test mode Control Signal 619 connects, the M macro inputs 606 from the non-macro circuit 601 to the N macro outputs 608 to the non-macro circuit 601 in a way that the macro block 603 is bypassed. In this mode, Control Signal 619 maps the M macro inputs 606 from the non-macro circuit 601 to the N macro outputs 608 to the non-macro circuit 601 through the bypass path circuit 605 while isolating the outputs 612 of the macro block 603. This arrangement creates a combinational bypass path across the macro block 603, Accordingly, for test purposes in this mode, the 600 effectively becomes the same circuit 100 as shown in FIG. 1, where using the Latches 611 conventional test scan methods may be utilized to test the non-macro circuit 601. The above described embodiments of the present invention, the hybrid circuits 300 and 600, are premised on existence of no logical feedback paths within the non-macro circuit which would connect any of the macro block outputs of to any of its inputs. Existence of such feedback path presents the problem of a combinational loop during test mode.

According to this embodiment of the invention, Latches 904 is added which prevents a combinational loop during test mode by interconnecting the feed back path through test path of 605.

Figure 9:
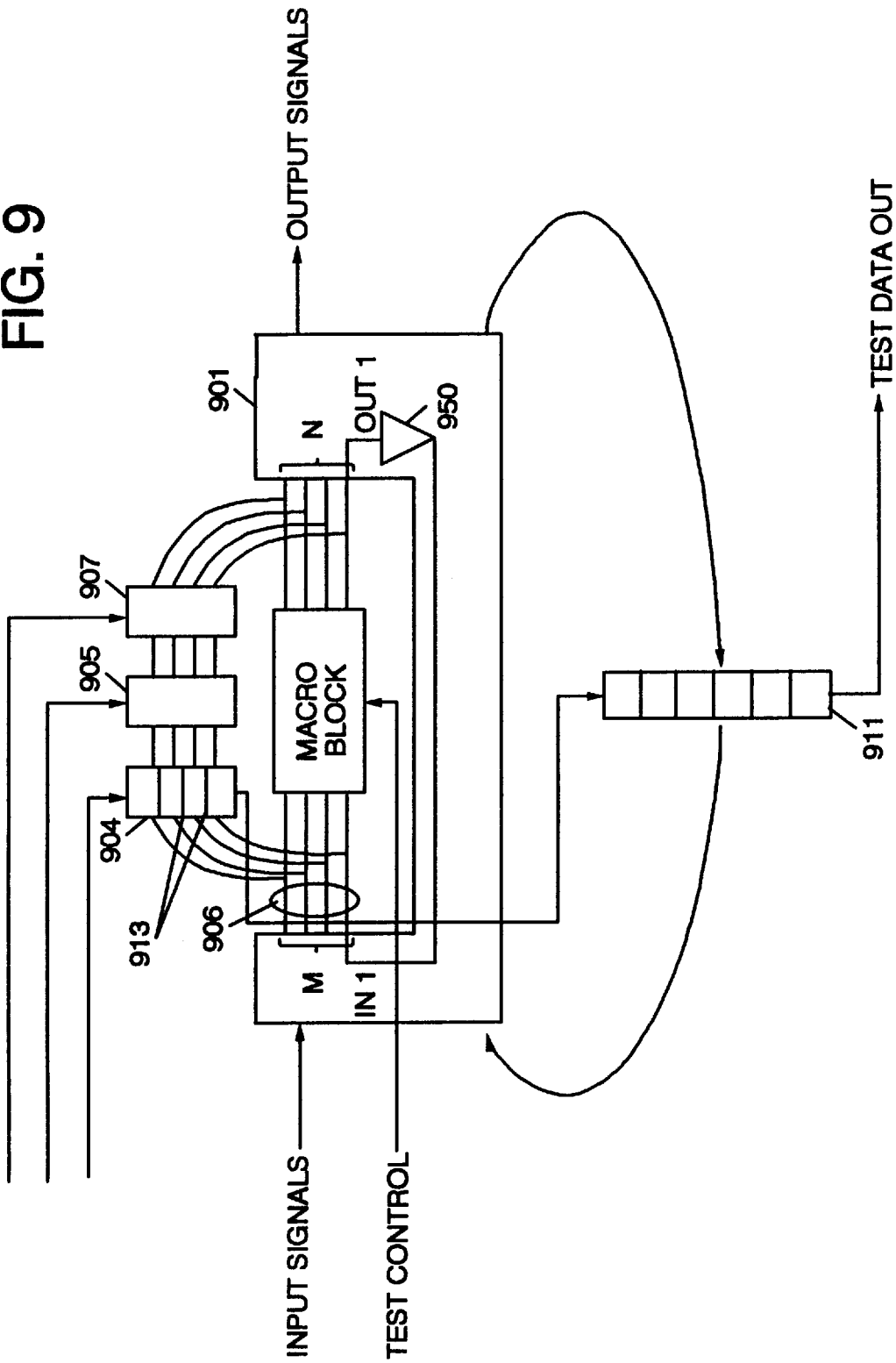
FIG. 9 is a circuit diagram of a hybrid circuit according to yet another embodiment of the present invention.

Referring to FIG. 9 yet another embodiment of the invention which includes combinational/sequential elements in a feed back path connecting one of the outputs of a macro block 903 to one of its inputs. As shown, the non-macro circuit 901 contains a logic gate 950 connecting OUT1 to IN1 representing a feedback path within the non-macro circuit 901 connecting the output of the macro block 903 to the input of the non-macro circuit 901. The circuitry for testing the non-macro circuit 901 is contained in Latches 904, M×N mapping circuit 905, and N×N test bridge 907. In this arrangement, M macro outputs 906 are also connected to Latches 904 where the output of Latches 904 is serially connected to the input of Latches 911. Latches 904 consists of M latch elements 913 which form a shift register in test mode. The combinational logic within the non-macro circuit 901 can be tested by scanning in test data through Test Data In at input of the Latches 904 and storing the measured result in Latches 904 and Latches 911. The measured result in Latches 904 and Latches 911 can then be scanned out through Test Data Out, as previously described. The introduction of latch elements 913 within the Latches 904 disables the feedback path and prevents creation of a combinational loop during test mode by allowing the transferring of the macro out signals 906 to non-macro inputs 908. Although not shown, this technique can be applied to a plurality of series and/or parallel connected imbedded functional blocks by creating a combinatorial and/or sequential logic path around the self tested functional blocks so as to allow known testing techniques to test the logic which generates signals entering or receives signals exiting the functional blocks. Those skilled in the art realize the previously described preferred embodiments can be combined as needed for the specific application.

What is claimed is:

1. A hybrid circuit capable of functioning in a functional mode and in a test mode in response to a test mode control signal, comprising:

a macro block having a first number of inputs and a second number of outputs;

a non-macro circuit having a first number of macro outputs connected to corresponding first number of inputs of the macro block, and a second number of macro inputs connected to corresponding second number of outputs of the macro block during functional mode;

an isolation circuit responsive to said test mode control signal for isolating the outputs of the macro block from the non-macro circuit during the test mode; and a bypass path circuit responsive to the test mode control signal for coupling the macro outputs from the non-macro circuit to the macro inputs to the non-macro circuit during test mode, and for isolating the macro outputs from the non-macro circuit from the macro inputs to the non-macro circuit during the functional mode.

2. The hybrid circuit of claim 1, wherein said bypass path circuit includes a mapping circuit for mapping the macro outputs from the non-macro circuit to the macro inputs to the non-macro circuit during the test mode.

3. The hybrid circuit of claim 2, wherein said isolation circuit and said mapping circuit are integrated into a single circuit block.

4. The hybrid circuit of claim 1 further including a feed back path coupling at least one of the outputs of the macro block to one of the inputs of the macro block; and a latch circuit coupled to said macro inputs for preventing the feed back path from bypassing the bypass path circuit.

5. An apparatus for testing a hybrid circuit including a macro block having outputs and inputs, and a non-macro circuit portion having macro inputs from the macro circuit and macro outputs to the macro circuit, comprising:

isolation means for isolating the outputs of the macro block from the non-macro circuit;

a bypass circuit path circuit means created across the macro block by coupling the macro outputs from the non-macro circuit to the macro inputs to the non-macro circuit.

6. The apparatus of claim 5 further comprising:

mapping means for mapping the macro outputs from the non-macro circuit to the macro inputs to the non-macro circuit.

7. The apparatus of claim 5 further comprising:

disabling means for disabling a feed back path coupling the macro outputs from the non-macro circuit to the macro inputs to the non-macro circuit.

8. A method for testing a hybrid circuit including a macro block and a non-macro circuit portion, comprising the steps of:

isolating the outputs of the macro block from the non-macro circuit;

creating a bypass circuit path across the macro block by coupling the non-macro outputs of the non-macro circuit to non-macro inputs of the non-macro circuit portion.

9. The method of claim 8 further comprising the step of:

mapping the non-macro outputs of the non-macro circuit to non-macro inputs of the non-macro circuit portion.

10. The method of claim 8 further including the steps of:

disabling a feed back path coupling macro outputs to macro inputs.

* * * * *